(12) United States Patent
Anzou

(10) Patent No.: US 10,001,524 B2
(45) Date of Patent: Jun. 19, 2018

(54) SEMICONDUCTOR INTEGRATED CIRCUIT AND TEST METHOD THEREOF

(71) Applicant: Kabushiki Kaisha Toshiba, Minato-ku, Tokyo (JP)

(72) Inventor: Kenichi Anzou, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 15/056,488

(22) Filed: Feb. 29, 2016

(65) Prior Publication Data

US 2017/0074939 A1 Mar. 16, 2017

(30) Foreign Application Priority Data

Sep. 11, 2015 (JP) ................. 2015-179951

(51) Int. Cl.
*G01R 31/28* (2006.01)
*G01R 31/317* (2006.01)
*G01R 31/3185* (2006.01)

(52) U.S. Cl.
CPC ......... *G01R 31/31724* (2013.01); *G01R 31/318547* (2013.01); *G01R 31/318555* (2013.01)

(58) Field of Classification Search
None
See application file for complete search history.

(56) References Cited

U.S. PATENT DOCUMENTS

| 2007/0226568 | A1 | 9/2007 | Anzou et al. |
| 2012/0117348 | A1* | 5/2012 | Triantafillou ......... G06F 21/566 711/163 |
| 2012/0246527 | A1 | 9/2012 | Anzou et al. |
| 2014/0129889 | A1 | 5/2014 | Matsumoto |
| 2014/0365839 | A1 | 12/2014 | Iwagami et al. |
| 2015/0262709 | A1 | 9/2015 | Anzou |
| 2016/0322093 | A1* | 11/2016 | Ghosh ................ G11C 14/0081 |

FOREIGN PATENT DOCUMENTS

JP 2005-221457 A 8/2005

* cited by examiner

*Primary Examiner* — Daniel McMahon
(74) *Attorney, Agent, or Firm* — White & Case LLP

(57) ABSTRACT

According to one embodiment, a semiconductor integrated circuit comprises: a tested block including a test control circuit; and a control circuit configured to output a first signal. The test control circuit performs a test of at least a first test pattern of the test patterns for the scan chain in accordance with the first signal during a first non-access state period of the tested block, and performs a test of at least a second test pattern following the first test pattern of the test patterns for the scan chain in accordance with the first signal during a second non-access state period of the tested block, and the test of the first test pattern and the test of the second test pattern are performed discontinuously.

16 Claims, 9 Drawing Sheets

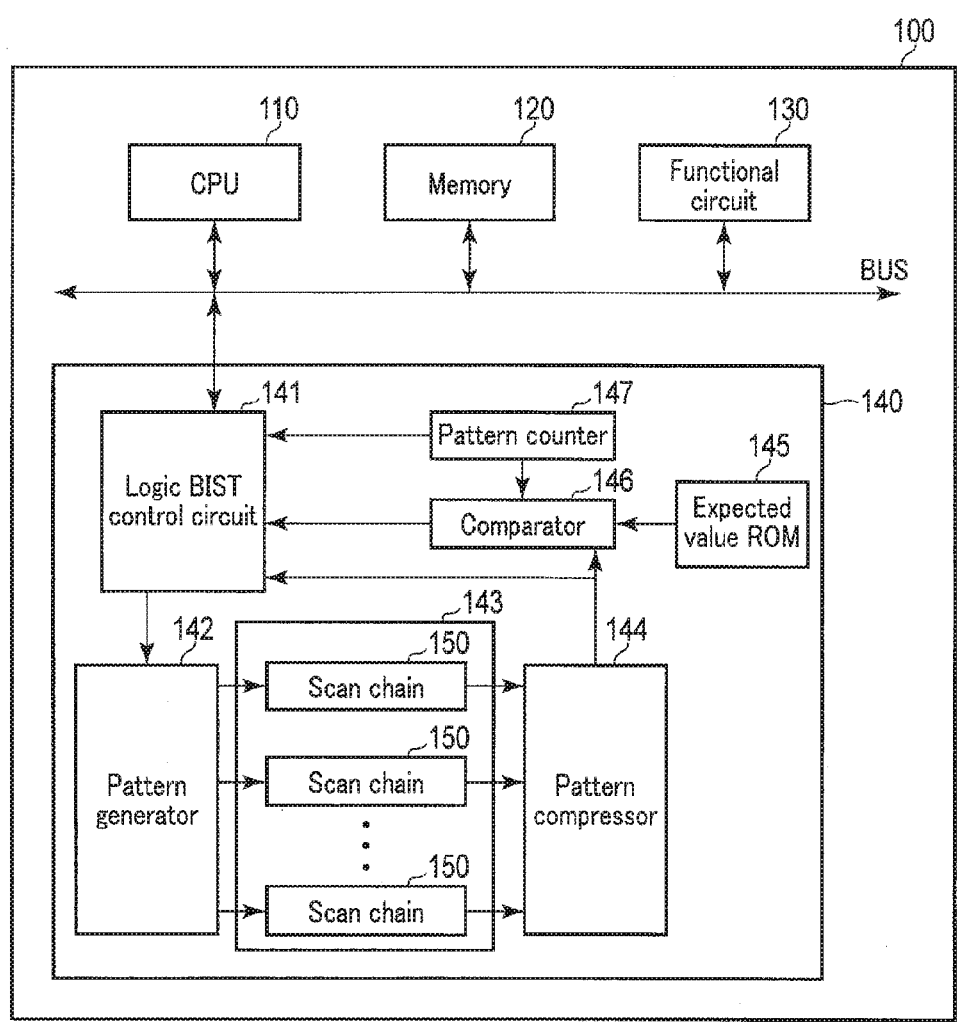
F I G. 1

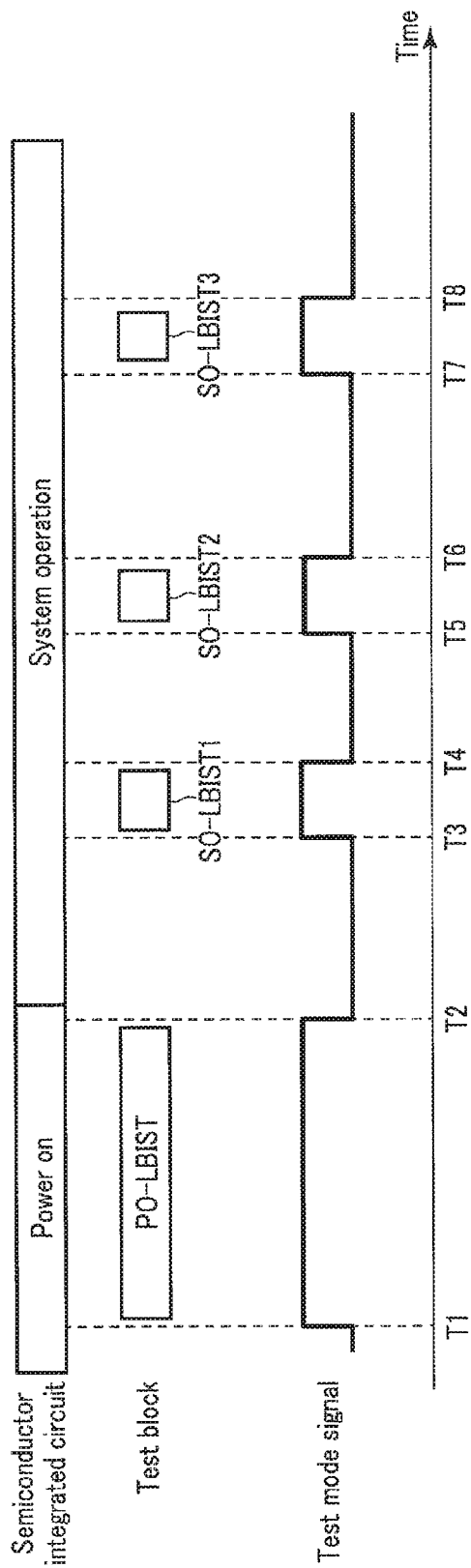
F I G. 4

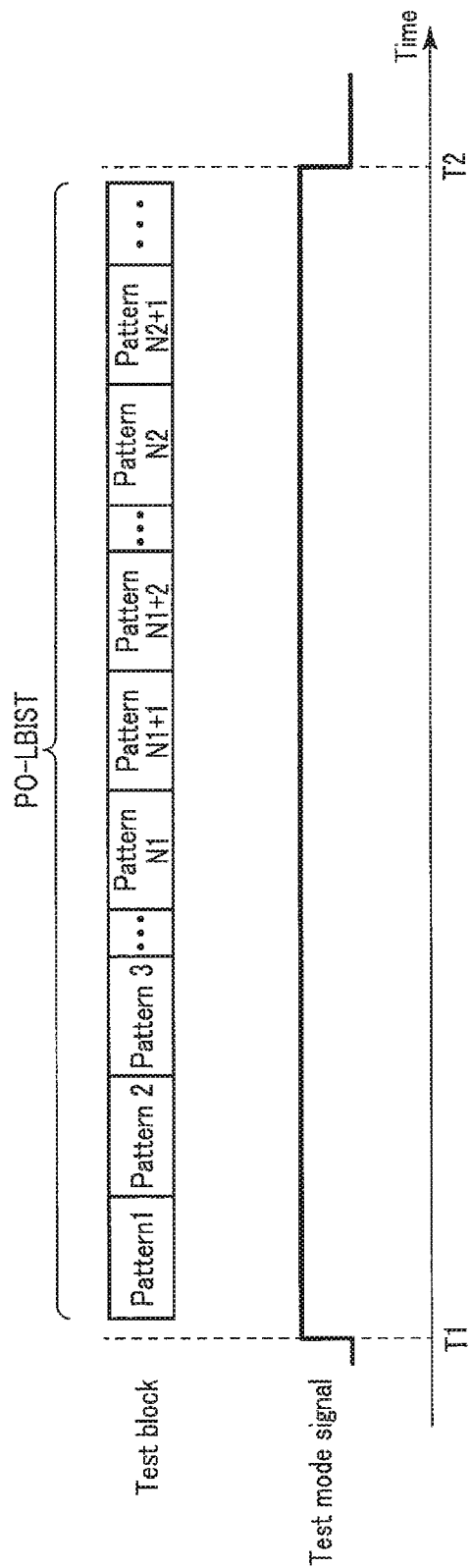
F I G. 5

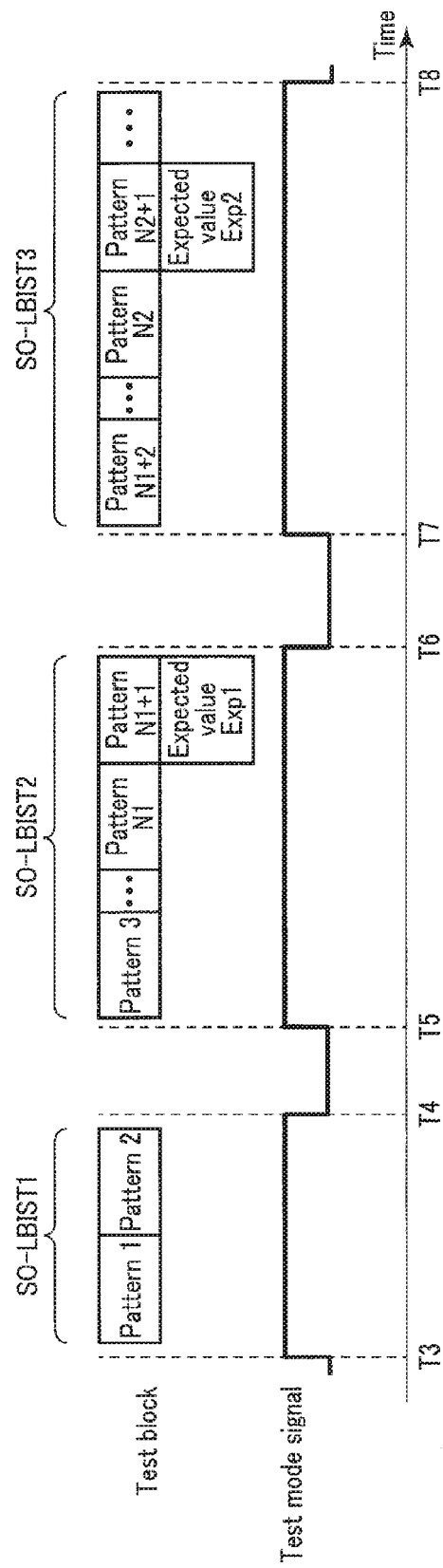
F I G. 6

SEMICONDUCTOR INTEGRATED CIRCUIT AND TEST METHOD THEREOF

CROSS-REFERENCE TO RELATED APPLICATIONS

This application is based upon and claims the benefit of priority from the prior Japanese Patent Application No. 2015-179951, filed Sep. 11, 2015, the entire contents of which are incorporated herein by reference.

FIELD

Embodiments described herein relate generally to a semiconductor integrated circuit and a test method thereof.

BACKGROUND

As one of test facilitation methods for solving the difficulty of a test of a large-scale complex semiconductor integrated circuit, a logic BIST (Built-In Self Test) is used. In the logic BIST, a test pattern is generated and input to a logic circuit. A test result output from the logic circuit is compressed, and the compressed value is analyzed. In the logic BIST, these operations are automatically performed in a semiconductor integrated circuit.

BRIEF DESCRIPTION OF THE DRAWING

FIG. 1 is a block diagram showing a semiconductor integrated circuit according to the first embodiment;

FIG. 4 is a timing chart showing the sequence of a logic BIST of the semiconductor integrated circuit according to the first embodiment;

FIG. 5 is a timing chart showing details of the sequence of a power-on logic BIST shown in FIG. 4;

FIG. 6 is a timing chart showing details of the sequence of a system operation logic BIST shown in FIG. 4;

DETAILED DESCRIPTION

Figures 2, 3:
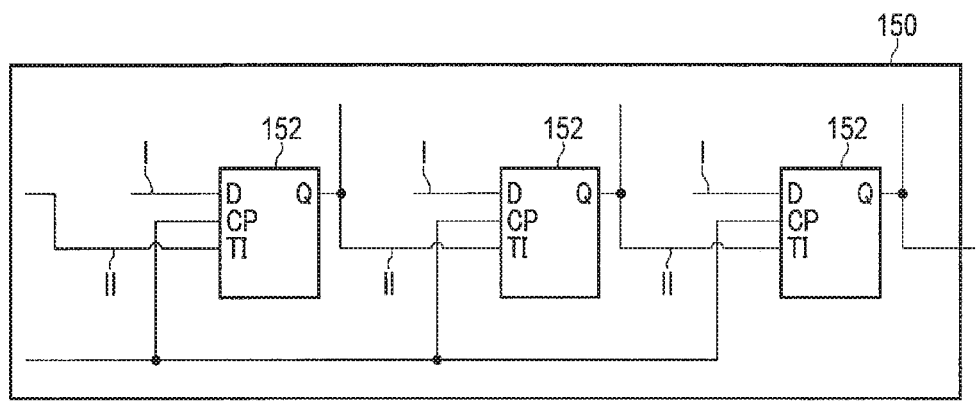
FIG. 2 is a block diagram showing a scan chain in the semiconductor integrated circuit according to the first embodiment.
FIG. 3 is a view showing an expected value ROM in the semiconductor integrated circuit according to the first embodiment.

In general, according to one embodiment, a semiconductor integrated circuit includes a tested block including a logic circuit including a scan chain including at least one scan register, and a test control circuit configured to perform a test of the logic circuit by test patterns using the scan chain, and a control circuit configured to output a first signal to the tested block during a non-access state period of the tested block. The test control circuit performs a test of at least a first test pattern of the test patterns for the scan chain in accordance with the first signal during a first non-access state period of the tested block, and performs a test of at least a second test pattern following the first test pattern of the test patterns for the scan chain in accordance with the first signal during a second non-access state period of the tested block, and the test of the first test pattern and the test of the second test pattern are performed discontinuously.

Embodiments will now be described with reference to the accompanying drawing. The same reference numerals denote the same parts throughout the drawing.

First Embodiment

A semiconductor integrated circuit according to the first embodiment will be described below with reference to FIGS. 1 to 6.

In the first embodiment, at the time of the system operation of a semiconductor integrated circuit 100, a logic BIST is performed for a logic circuit 143 during a period in which a tested block 140 is in a non-access state. At this time, a logic BIST of test patterns of the total pattern count is performed divisionally in a plurality of non-access state periods. This makes it possible to perform the logic BIST at the time of the system operation and implement a reliable device.

The first embodiment will be described below in detail.

Arrangement Example of First Embodiment

FIG. 1 is a block diagram showing the semiconductor integrated circuit 100 according to the first embodiment. FIG. 2 is a block diagram showing a scan chain 150 in the semiconductor integrated circuit 100 according to the first embodiment. FIG. 3 is a view showing an expected value ROM 145 in the semiconductor integrated circuit 100 according to the first embodiment.

Note that in the following explanation, "connection" includes not only direct connection but also connection via an arbitrary element, unless otherwise specified.

As shown in FIG. 1, the semiconductor integrated circuit 100 includes a CPU (control circuit) 110, a memory 120, a functional circuit 130, and the tested block 140. These elements are electrically coupled to each other by a bus.

The CPU 110 controls the entire semiconductor integrated circuit 100. At the time of power-on, the CPU 110 output a test mode signal to the tested block 140. The CPU 110 also outputs the test mode signal to the tested block 140 during the non-access state period of the tested block 140 at the time of the system operation.

The memory 120 is, for example, a NAND flash memory and stores data from the outside.

The functional circuit 130 has various functions. The functional circuit 130 may include a tested block other than the tested block 140.

The tested block 140 includes a logic BIST control circuit 141, a pattern generator 142, the logic circuit 143, a pattern compressor 144, the expected value ROM 145, a comparator 146, and a pattern counter 147.

The logic BIST control circuit 141 controls the test operation of the entire tested block 140. The logic BIST control circuit 141 performs a logic BIST for the logic circuit 143 in accordance with the test mode signal from the CPU 110. The logic BIST control circuit 141 outputs control signals to the pattern generator 142, the logic circuit 143, the pattern compressor 144, and the comparator 146.

The pattern generator 142 generates test patterns to be serially output to the plurality of scan chains 150. The pattern generator 142 generates a plurality of test patterns, and the plurality of test patterns are sequentially input to each scan chain 150. The pattern generator 142 is a pseudo random pattern generator, and generates a random pattern such as a pseudo random pattern. An example of the pseudo random pattern generator is an LFSR (Linear Feedback Shift Register).

The logic circuit 143 includes the plurality of scan chains 150. In the test mode, the plurality of test patterns from the pattern generator 142 are sequentially serially input to each scan chain 150. System clock is applied to capture the output of the logic correspond to the logic inputs set by the scan shift operation. A serial output value (test result) from each scan chain 150 is input to the pattern compressor 144.

As shown in FIG. 2, each scan chain 150 includes one or more scan registers. At least one of the plurality of scan registers includes a plurality of flip-flops 152. Each of the plurality of flip-flops 152 has input terminals D and TI, a clock terminal CP, and an output terminal Q.

Data from the system logic is input to the input terminal D via a first path I. Scan shift data (test pattern inputs and captured test results) is input to the input terminal TI via a second path II. The output terminal of the flip-flop 152 of the preceding stage is coupled to the input terminal TI. A clock is input to the clock terminal CP. The output terminal Q outputs the status value of the flip-flop 152.

In a normal mode, the flip-flop 152 selects and stores the system data from the input terminal D in synchronism with the clock CP, and outputs the status value to the output terminal Q. On the other hand, in the test mode, the flip-flop 152 selects and stores test data from the input terminal TI in synchronism with the clock CP, and outputs the status value to the output terminal Q. That is, in the test mode, the plurality of flip-flops 152 are coupled in series, and test data from the flip-flop 152 of the preceding stage is sequentially input/output. Switching between the normal mode and the test mode (switching between normal data input and test data input) is done in accordance with a test enable signal TE (not shown). The test enable signal TE is input to the flip-flop 152.

Referring back to FIG. 1, the pattern compressor 144 is provided on the output side of each scan chain 150, and compresses the test result from each scan chain 150. The pattern compressor 144 sequentially cumulatively compresses test results by the plurality of test patterns. The pattern compressor 144 outputs the compressed value to the comparator 146. The pattern compressor 144 is, for example, an MISR (Multi Input Shift Resister).

For example, the pattern compressor 144 compresses the test result of the test pattern of pattern count 1 (compressed value 1). Next, the pattern compressor 144 compresses the test result of the test pattern of pattern count 2 (compressed value 2). At this time, the pattern compressor 144 cumulatively compresses the test result of the test pattern of pattern count 2 in addition to the test result of the test pattern of pattern count 1. That is, compressed value 2 is the cumulative value of the test result of the test pattern of pattern count 1 and the test result of the test pattern of pattern count 2. After that, in a similar manner, the pattern compressor 144 sequentially performs compression up to the test result of the test pattern of pattern count N4 while storing the compressed value at the present time.

The expected value ROM 145 stores the compressed expected value of a test result in advance. At this time, the expected value ROM 145 stores not the compressed expected values of test patterns of the total pattern count but the compressed expected values of test patterns of a predetermined pattern count. More specifically, as shown in FIG. 3, the expected value ROM has a table of predetermined pattern counts and corresponding compressed expected values. For example, compressed expected values Exp1 to Exp4 correspond to pattern counts N1 to N4, respectively (N1<N2<N3<N4).

When the pattern count of the compressed value from the pattern compressor 144 matches the pattern count of an compressed expected value in the expected value ROM, the comparator 146 compares (analyzes) the compressed value and the compressed expected value. The pattern count of the compressed value from the pattern compressor 144 is counted by the pattern counter 147. The pattern counter 147 stores the pattern count at the present time. When the compressed value from the pattern compressor 144 does not match the compressed expected value from the expected value ROM 145, the comparator 146 determines that the test result is "failure" and notifies the logic BIST control circuit of it.

Logic BIST of First Embodiment

FIG. 4 is a timing chart showing the sequence of a logic BIST of the semiconductor integrated circuit 100 according to the first embodiment. FIG. 5 is a timing chart showing details of the sequence of a power-on logic BIST shown in FIG. 4. FIG. 6 is a timing chart showing details of the sequence of a system operation logic BIST shown in FIG. 4.

A logic BIST indicates the processes of test pattern generation, scan-in (test pattern input), test result capture, scan-out (test result output), test result (output value) compression, and compressed value comparison (analysis). In the logic BIST, the processes are performed for a plurality of test patterns (in this example, the test patterns (patterns 1 to N4) of pattern counts 1 to N4).

As shown in FIG. 4, in the first embodiment, a logic BIST is performed for the tested block at each of the time of power-on of the semiconductor integrated circuit 100 and the time of the system operation of the semiconductor integrated circuit 100 after power-on. Here, the time of the system operation indicates the time after the power-on sequence during which the power supply voltage is applied to at least part of the semiconductor integrated circuit 100. The time of power-on indicates, for example, the time of the power-on sequence or the time immediately after the power-on sequence.

At the time of power-on of the semiconductor integrated circuit 100, the CPU 110 sets the test mode signal to H level and outputs it to the logic BIST control circuit 141 from time T1 to time T2. The length of the period from time T1 to time T2 is recognized by the CPU 110. According to the test mode signal of H level, the logic BIST control circuit 141 performs a power-on logic BIST (PO-LBIST) for the tested block 140 (logic circuit 143) during the period from time T1 to time T2.

More specifically, as shown in FIG. 5, the test is sequentially performed for the logic circuit 143 from the test pattern (pattern 1) of the pattern count 1 in the power-on logic BIST (PO-LBIST) (from time T1 to time T2).

Note that in FIG. 5, the test of pattern 2 starts at the same time as the end of the test of pattern 1. However, compression of the test result of pattern 1 and generation of pattern 2 and the like may be performed in parallel. Normally, scan-out of the preceding pattern (pattern 1) and scan-in of the next pattern (pattern 2) are performed simultaneously.

After that, the test is performed up to the test pattern (pattern N4) of pattern count N4, and the compressed value up to pattern N4 and the compressed expected value of pattern N4 are compared.

As described above, in one power-on logic BIST (PO-LBIST), the tests of pattern 1 to pattern N4 are continuously performed.

Referring back to FIG. 4, at the time of the system operation of the semiconductor integrated circuit 100 after power-on, the CPU 110 sets the test mode signal to H level and outputs it to the logic BIST control circuit 141 from time T3 to time T4, from time T5 to time T6, and from time T7 to time T8. The periods from time T3 to time T4, from time T5 to time T6, and from time T7 to time T8 are the non-access periods of the tested block 140. The non-access period is a period in which data or a command from the system is not input to the tested block 140, and the tested block 140 is not performing the operation of the system function.

The lengths of the periods from time T3 to time T4, from time T5 to time T6, and from time T7 to time T8 are recognized by the CPU 110. According to the test mode signal of H level, the logic BIST control circuit 141 performs each of system operation logic BISTs 1 to 3 (SO-LBIST1 to SO-LBIST3) for the tested block 140 (logic circuit 143) during a corresponding one of the periods from time T3 to time T4, from time T5 to time T6, and from time T7 to time T8.

More specifically, as shown in FIG. 6, the tests of the test pattern (pattern 1) of pattern count 1 and the test pattern (pattern 2) of pattern count 2 are sequentially performed for the logic circuit 143 in the system operation logic BIST 1 (SO-LBIST1) (from time T3 to time T4).

Next, the test is sequentially performed for the logic circuit 143 from the test pattern (pattern 3) of pattern count 3 in the system operation logic BIST 2 (SO-LBIST2) (from time T5 to time T6). After that, the test is performed up to the test pattern (pattern N1) of pattern count N1, and the compressed value up to pattern N1 and the compressed expected value of pattern N1 are compared. At this time, the test of pattern N1+1 is performed in parallel.

Next, the test is sequentially performed for the logic circuit 143 from the test pattern (pattern N1+2) of pattern count N1+2 in the system operation logic BIST 3 (SO-LBIST3) (from time T7 to time T8). After that, the test is performed up to the test pattern (pattern N2) of pattern count N2, and the compressed value up to pattern N2 and the compressed expected value of pattern N2 are compared. At this time, the test after pattern N2+1 is performed in parallel. The test is similarly performed up to the test patterns (patterns N3 and N4) of pattern counts N3 and N4, and the compressed values up to patterns N3 and N4 and corresponding compressed expected values are compared.

As described above, in the system operation logic BIST, the tests of pattern 1 to pattern N4 are divisionally and discontinuously performed in the plurality of non-access state periods.

The pattern count at the end of each system operation logic BIST is stored in the pattern counter 147, and the compressed value of the test result is stored in the pattern compressor 144. The next system operation logic BIST is performed continuously by referring to the pattern count and the compressed value of the test result.

Note that in this example, the system operation logic BISTs 1 to 3 are performed in the three non-access periods. However, the present invention is not limited to this. The system operation logic BIST may be performed in four or more non-access periods. The pattern count in one non-access period is determined by the length of the non-access period, and controlled by the CPU 110.

Effects of First Embodiment

In a comparative example, a logic BIST of the logic circuit of a tested block is performed at the time of power-on of a semiconductor integrated circuit. However, conditions (for example, the device temperature and voltage) change between the time of power-on and the time of the system operation. For this reason, if the test is performed only under the conditions at the time of power-on, it is not reliable that the logic circuit can be normal even under the conditions at the time of the system operation. Hence, the test at the time of power-on does not suffice for a device that needs to be highly reliable.

On the other hand, in the first embodiment, a logic BIST is performed for the logic circuit 143 during the period in which the tested block 140 is in the non-access state at the time of the system operation of the semiconductor integrated circuit 100. The non-access state period is a relatively short period. For this reason, in one non-access state period, the test is performed for the test patterns (test patterns up to a halfway pattern count) of some pattern counts (for example, 1 and 2) out of all pattern counts (for example, 1 to N4). That is, the tests of the test patterns of total pattern count are performed not in one non-access state period but divisionally in a plurality of non-access state periods. This can perform the logic BIST to the end even if the non-access state period is relatively short. It is therefore possible to perform the logic BIST under the conditions at the time of the system operation and implement a reliable device.

In the first embodiment, the results of test patterns are sequentially cumulatively compressed. At this time, instead of analyzing the compression result for each of the test patterns of the total pattern count, the compression result is analyzed for the test patterns of a predetermined pattern count (for example, N1 or N2). That is, the value of the compression result of test patterns up to the predetermined pattern count and a corresponding compressed expected value are compared. This makes it possible to decrease the number of compressed expected values to be held and reduce the capacity of the storage area (expected value ROM 145).

Note that in the first embodiment, the compressed expected value is stored in the expected value ROM 145 in advance. However, the present invention is not limited to this. The compressed expected value may be stored in a RAM. In this case, the CPU 110 may change the compressed expected value as needed. The compressed expected value may be stored in a storage element such as an SRAM or register in the CPU 110 and changed as needed.

Second Embodiment

A semiconductor integrated circuit according to the second embodiment will be described below with reference to FIGS. 7 and 8.

In the second embodiment, the non-access state period of a tested block 140 is the period according to power-off of the tested block 140 (the period before and after power-off).

In the second embodiment, a system operation logic BIST is performed before the power-off sequence (shut-off sequence) of the tested block 140. The compressed value of the test result and the pattern count at the present time are transferred to and stored in another functional circuit 130 in the power-on state. With this arrangement, the next system operation logic BIST can correctly be performed from midway without erasing the compressed value or pattern count of the tested block 140.

The second embodiment will be described below in detail. Note that a description of the same points as in the first embodiment will be omitted in the second embodiment, and different points will mainly be explained.

Arrangement Example of Second Embodiment

Figure 7:
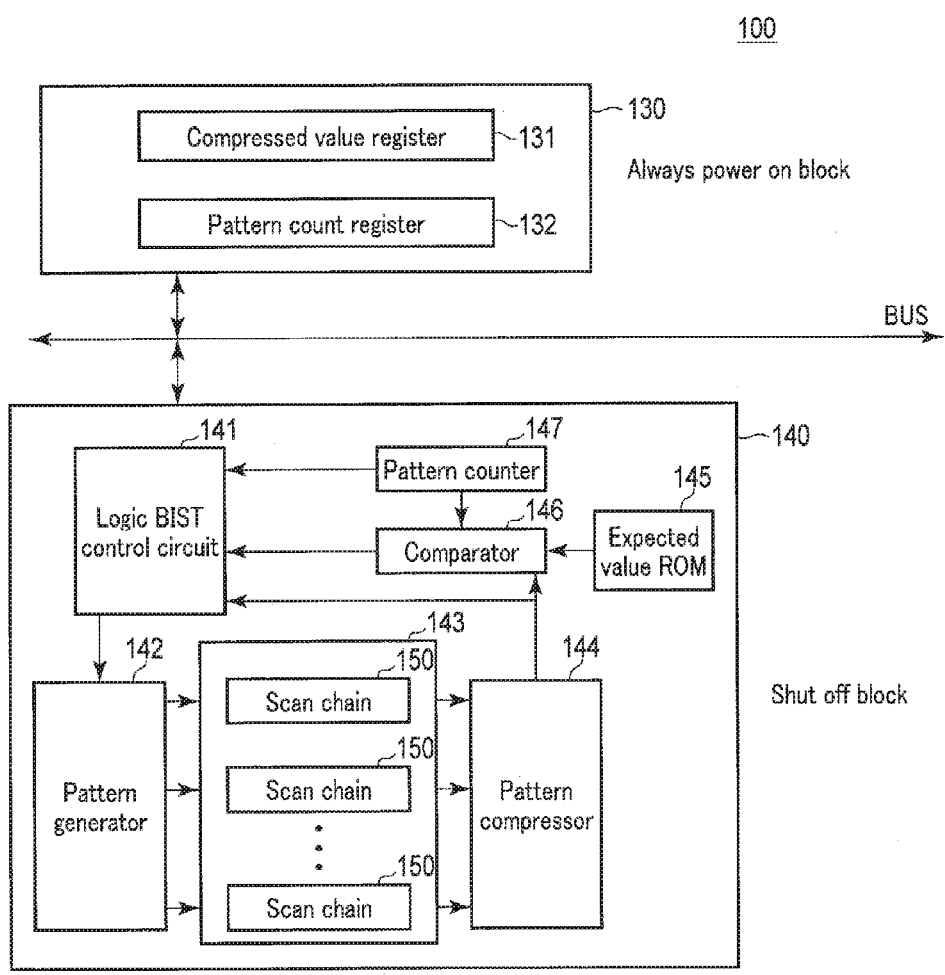
FIG. 7 is a block diagram showing a semiconductor integrated circuit according to the second embodiment.

FIG. 7 is a block diagram showing a semiconductor integrated circuit 100 according to the second embodiment.

As shown in FIG. 7, the functional circuit 130 of the semiconductor integrated circuit 100 includes a compressed value register 131 and a pattern count register 132. The tested block 140 and the functional circuit 130 are electrically coupled to each other by a bus.

The compressed value register 131 stores the compressed value of a halfway test result stored in a pattern compressor 144. The pattern count register 132 stores a halfway pattern count stored in a pattern counter 147.

The functional circuit 130 including the compressed value register 131 and the pattern count register 132 is always in the power-on state.

Logic BIST of Second Embodiment

Figure 8:
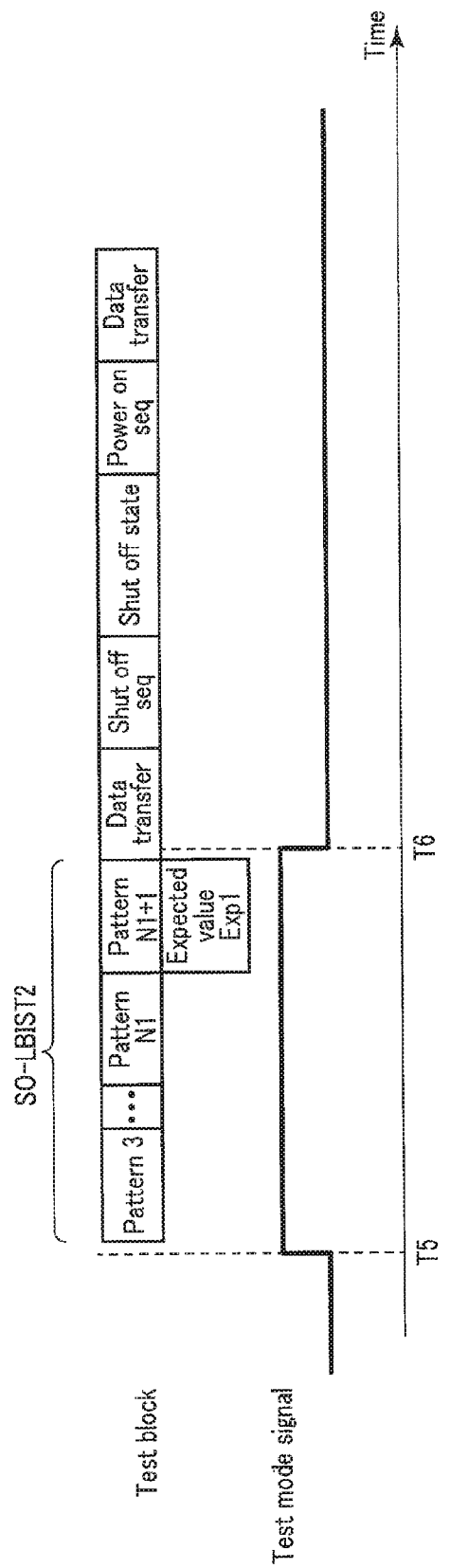
FIG. 8 is a timing chart showing details of the sequence of a system operation logic BIST of the semiconductor integrated circuit according to the second embodiment.

FIG. 8 is a timing chart showing details of the sequence of a system operation logic BIST of the semiconductor integrated circuit 100 according to the second embodiment. A system operation logic BIST 2 from time T5 to time T6 shown in FIG. 4 will be described here as an example.

As shown in FIG. 8, the system operation logic BIST 2 from time T5 to time T6 is performed before the power-off sequence (shut-off sequence) of the tested block 140. In the system operation logic BIST 2, the test is sequentially performed for a logic circuit 143 from the test pattern (pattern 3) of pattern count 3. After that, the test is performed up to the test pattern (pattern N1) of pattern count N1, and the compressed value up to pattern N1 and the compressed expected value of pattern N1 are compared. At this time, the test of pattern N1+1 is performed in parallel.

Next, test information data is transferred from the tested block 140 to the functional circuit 130. More specifically, the data of the compressed value of the test result up to pattern N1+1 is transferred to the compressed value register 131 of the functional circuit 130. In addition, the data of pattern count N1+1 is transferred to the pattern count register 132 of the functional circuit 130.

After that, the power-off sequence of the tested block 140 is performed, and the tested block 140 is set in the power-off state. At this time, the functional circuit 130 maintains the power-on state. Then, the power-on sequence is performed, and the tested block 140 is set in the power-on state. After setting the power-on state, the functional circuit 130 transfers the data of the compressed value of the test result and the data of the pattern count to the tested block 140.

As described above, the system operation logic BIST 2, the test information data transfer, and the power-off sequence are continuously performed.

After that, a system operation logic BIST 3 is performed before the next power-off sequence, although not illustrated.

Effects of Second Embodiment

When the tested block 140 is powered off, the compressed value of the halfway test result stored in the pattern compressor 144 and the halfway pattern count stored in the pattern counter 147 are erased. In this case, the next system operation logic BIST cannot correctly be performed continuously from the end of the preceding system operation logic BIST.

In the second embodiment, however, a system operation logic BIST is performed before the power-off sequence (shut-off sequence) of the tested block 140. The compressed value of the test result and the pattern count at the present time are transferred to and stored in the functional circuit 130 in the power-on state. This makes it possible to avoid erasure of the compressed value and the pattern count upon powering off the tested block 140 and correctly perform a system operation logic BIST from halfway.

Note that if not a ROM but a RAM stores a compressed expected value, data in the RAM is also erased upon powering off. Hence, in this case, data in the RAM is also preferably transferred to and stored in the functional circuit 130.

Third Embodiment

A semiconductor integrated circuit according to the third embodiment will be described below with reference to FIGS. 9 and 10.

The third embodiment is a modification of the second embodiment, in which some flip-flops 152 in a scan chain 150 are state retention flip-flops.

In the third embodiment, data of the flip-flop 152 is stored in a data latch 153 before a system operation logic BIST. With this arrangement, a test at the time of shut-off can be performed without erasing the data in the flip-flop 152.

The third embodiment will be described below in detail. Note that a description of the same points as in the second embodiment will be omitted in the third embodiment, and different points will mainly be explained.

Arrangement Example of Third Embodiment

Figure 9:
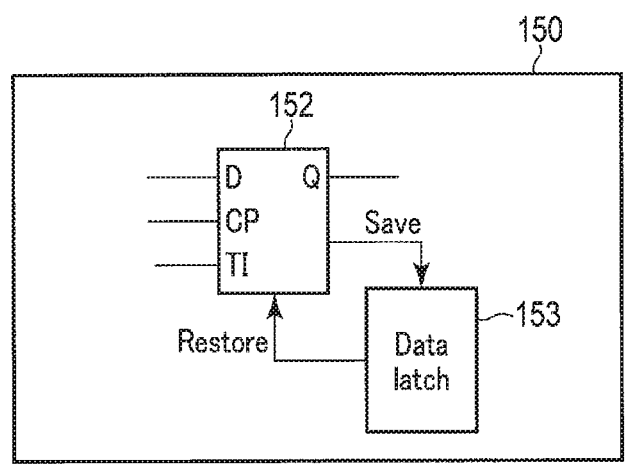
FIG. 9 is a block diagram showing part of a scan chain in a semiconductor integrated circuit according to the third embodiment.

FIG. 9 is a block diagram showing part of the scan chain 150 in the semiconductor integrated circuit 100 according to the third embodiment. Note that FIG. 9 illustrates only one flip-flop 152.

As shown in FIG. 9, at least one of a plurality of scan registers belonging to the scan chain 150 includes the flip-flop 152 and the data latch 153.

The flip-flop 152 is a status flip-flop. The flip-flop 152 stores the current status of a logic circuit 143.

The data latch 153 is provided in correspondence with the flip-flop 152. The data latch 153 temporarily stores data of the flip-flop 152. The data latch 153 is electrically coupled to a power supply different from that of the flip-flop 152. For this reason, even if the flip-flop 152 (tested block 140) is powered off, the data latch 153 maintains the power-on state.

Logic BIST of Third Embodiment

Figure 10:
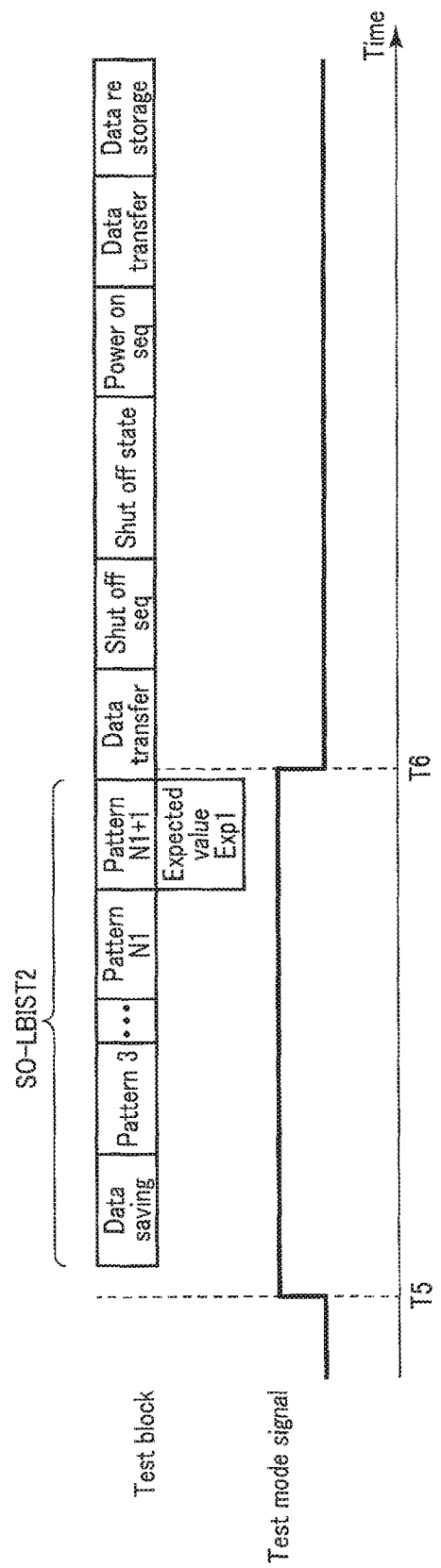
FIG. 10 is a timing chart showing details of the sequence of a system operation logic BIST of the semiconductor integrated circuit according to the third embodiment.

FIG. 10 is a timing chart showing details of the sequence of a system operation logic BIST of the semiconductor integrated circuit 100 according to the third embodiment. A system operation logic BIST 2 from time T5 to time T6 shown in FIG. 4 will be described here as an example.

As shown in FIG. 10, data (the current status data of the logic circuit 143) in the flip-flop 152 is stored in the data latch 153 before the system operation logic BIST 2 from time T5 to time T6.

Next, a system operation logic BIST 2 is performed from time T5 to time T6. After that, the data of the compressed value of the test result and the data of the pattern count are transferred from the tested block 140 to a functional circuit 130. Subsequently, the shut-off sequence of the tested block 140 is performed, and the tested block 140 is set in the shut-off state. At this time, the functional circuit 130 maintains the power-on state. The data latch 153 also maintains the power-on state. Then, the power-on sequence is performed, and the tested block 140 is set in the power-on state. After setting the power-on state, the functional circuit 130 transfers the data of the compressed value of the test result and the data of the pattern count to the tested block 140.

The data stored in the data latch 153 is stored in the flip-flop 152 again. Note that the re-storage in the flip-flop 152 may be performed before or in parallel to the transfer of the data of the compressed value of the test result and the data of the pattern count from the functional circuit 130 to the tested block 140.

As described above, the status data storage, the system operation logic BIST 2, the test information data transfer, and the shut-off sequence are continuously performed.

After that, a system operation logic BIST 3 is performed before the next shut-off sequence, although not illustrated.

Effects of Third Embodiment

When the flip-flop 152 is a state retention flip-flop, the flip-flop 152 stores the current status of the logic circuit 143. However, when the flip-flop 152 is tested or powered off, data in the flip-flop 152 is erased.

To prevent this, in the third embodiment, the data latch 153 provided in correspondence with the flip-flop 152 is used to hold the data stored in the flip-flop. The status data in the flip-flop 152 is stored in the data latch 153 before a system operation logic BIST. This enables to do a test at the time of shut-off without erasing the data in the flip-flop 152.

Note that in this example, a case in which the non-access state period of the tested block 140 is the period according to shut-off has been described. However, the present invention is not limited to this. The status data in the flip-flop 152 may be stored in the data latch 153 before a system operation logic BIST during a non-access state period other than the shut-off period.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a tested block including a logic circuit including a scan chain including one or more scan registers, and a test control circuit configured to perform a test of the logic circuit by test patterns using the scan chain; and
   a control circuit configured to output a first signal to the tested block during a non-access state period of the tested block,
   wherein the test control circuit performs a logic test of at least a first test pattern of the test patterns for the logic circuit including the scan chain in accordance with the first signal during a first non-access state period of the tested block, and
   performs a logic test of at least a second test pattern following the first test pattern of the test patterns for the logic circuit including the scan chain in accordance with the first signal during a second non-access state period of the tested block,
   the logic test of the first test pattern and the logic test of the second test pattern are performed discontinuously,
   at least one of the scan registers belonging to the scan chain includes a first flip-flop configured to store status data of the logic circuit, and a data latch corresponding to the first flip-flop, and
   the status data stored in the first flip-flop is stored in the data latch before the test of the logic circuit by the test patterns, and the status data is held even when the tested block to which the logic circuit belongs is powered off.

2. The circuit of claim 1, wherein the test control circuit cumulatively compresses test results until reaching to a predetermined point in the test patterns to generate a first compressed value, and compares the first compressed value with a first pre-computed compressed expected value of the test results at the predetermined point in the test patterns.

3. The circuit of claim 2, wherein the first compressed expected value is stored in a ROM in the tested block.

4. The circuit of claim 2, wherein the first compressed expected value is stored in a storage element comprising one of an SRAM and a register in the control circuit.

5. The circuit of claim 1, wherein the non-access state period of the tested block contains a shut-off period of the tested block.

6. The circuit of claim 5, further comprising a functional circuit configured to store test information data of the tested block obtained as a result of a test performed by the test control circuit before a shut-off sequence of the tested block.

7. The circuit of claim 6, wherein the test information data of the tested block includes a compressed value obtained by cumulatively compressing test results of performed test patterns and a count of the performed test patterns.

8. A test method of, in a semiconductor integrated circuit including a logic circuit including a scan chain including one or more scan registers, performing a test of the logic circuit by a plurality of test patterns using the scan chain, the test method comprising:
   performing a logic test of at least a first test pattern of the test patterns for the logic circuit including the scan chain during a first non-access state period of the tested block, and
   performing a logic test of at least a second test pattern following the first test pattern of the test patterns for the logic circuit including the scan chain during a second non-access state period of the tested block,
   wherein the logic test of the first test pattern and the logic test of the second test pattern are performed discontinuously,
   at least one of the scan registers belonging to the scan chain includes a first flip-flop configured to store status data of the logic circuit, and a data latch corresponding to the first flip-flop, and
   the status data stored in the first flip-flop is stored in the data latch before the test of the logic circuit by the test patterns, and the status data is held even when the tested block to which the logic circuit belongs is powered off.

9. The method of claim 8, further comprising cumulatively compressing test results until reaching to a predetermined point in the test patterns to generate a first compressed value and comparing the first compressed value with a first pre-computed compressed expected value of the test results at the predetermined point in the test patterns.

10. The method of claim 9, wherein the first compressed expected value is stored in a ROM in the tested block.

11. The method of claim 9, wherein the first compressed expected value is stored in a storage element comprising one of an SRAM and a register in the control circuit.

12. The method of claim 8, wherein each of the first non-access state period and the second non-access state period of the tested block is a period before or after a shut-off sequence of the tested block.

13. The method of claim 12, further comprising storing test information data of the tested block obtained as a result of a performed test before a shut-off sequence of the tested block.

14. The method of claim 13, wherein the test information data of the tested block includes a compressed value obtained by cumulatively compressing test results of performed test patterns and a count of the performed test patterns.

15. The circuit of claim 1, wherein the tested block further includes a pattern generator which is connected to input of the scan chain and a pattern compressor which is connected to output of the scan chain, and the test control circuit instructs the pattern generator to generate the test pattern and instructs the pattern compressor to compress test results to generate a pre-computed compressed value.

16. The circuit of claim 15, wherein the tested block further includes a comparator which is connected to output of the pattern compressor, and the test control circuit instructs the comparator to compares the compressed value with a pre-computed compressed expected value of the test results.

* * * * *